(12) United States Patent
Tajima et al.

(10) Patent No.: US 7,989,300 B2
(45) Date of Patent: Aug. 2, 2011

(54) METHOD OF MANUFACTURING SEMICONDUCTOR DEVICE

(75) Inventors: Mitsugu Tajima, Yokohama (JP); Takae Sukegawa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/849,795

(22) Filed: Aug. 3, 2010

(65) Prior Publication Data

US 2011/0033997 A1 Feb. 10, 2011

(30) Foreign Application Priority Data

Aug. 4, 2009 (JP) ................................. 2009-181166

(51) Int. Cl.
*H01L 21/336* (2006.01)
(52) U.S. Cl. .. 438/303; 438/301; 438/719; 257/E21.438
(58) Field of Classification Search .................. 438/301, 438/303, 719
See application file for complete search history.

(56) References Cited

U.S. PATENT DOCUMENTS

| | | | | |
|---|---|---|---|---|
| 6,165,826 A * | 12/2000 | Chau et al. | ..................... | 438/231 |
| 7,005,366 B2 * | 2/2006 | Chau et al. | ..................... | 438/591 |
| 7,723,235 B2 * | 5/2010 | Kurihara et al. | ............... | 438/694 |
| 2002/0179970 A1 * | 12/2002 | Yagishita et al. | .............. | 257/350 |
| 2004/0219743 A1 * | 11/2004 | Fang et al. | ...................... | 438/232 |
| 2005/0095796 A1 * | 5/2005 | van Bentum et al. | ......... | 438/300 |
| 2006/0292796 A1 * | 12/2006 | Ho | ................. | 438/257 |
| 2008/0073733 A1 | 3/2008 | Kudo et al. | | |
| 2008/0233746 A1 * | 9/2008 | Huang et al. | ................... | 438/689 |
| 2009/0155973 A1 * | 6/2009 | Tsujii | ............................ | 438/305 |
| 2010/0062591 A1 * | 3/2010 | Lin et al. | ....................... | 438/585 |
| 2010/0087038 A1 * | 4/2010 | Chung et al. | ................... | 438/199 |

FOREIGN PATENT DOCUMENTS

JP 11-238879 A 8/1999
JP 2008-78403 A 4/2008

* cited by examiner

*Primary Examiner* — Alexander G Ghyka (74) *Attorney, Agent, or Firm* — Fujitsu Patent Center

(57) ABSTRACT

A method of manufacturing a semiconductor device includes forming a gate insulating film over a semiconductor substrate, forming a silicon film over the gate insulating film, forming a resist pattern over the silicon film, etching the silicon film to form a protrusion portion of the silicon film, forming a dummy film over the silicon film, etching the dummy film so that the dummy film is partially remained on sidewalls of the protrusion portion, etching the silicon film using the remaining dummy film to form a gate electrode, and performing ion implantation into the semiconductor substrate to form source/drain regions.

10 Claims, 13 Drawing Sheets

METHOD OF MANUFACTURING SEMICONDUCTOR DEVICE

CROSS REFERENCE TO RELATED APPLICATIONS

This application is based upon and claims the benefit of priority from the prior Japanese Patent Application No. 2009-181166, filed on Aug. 4, 2009, the entire contents of which is incorporated herein by reference.

FIELD

The present invention relates to a method of manufacturing a semiconductor device, and more particularly relates to a method for manufacturing a semiconductor device including a MOS transistor.

BACKGROUND

A MOS transistor is formed by a process including forming a polysilicon gate electrode by patterning, performing ion implantation into a silicon substrate to form extension regions, forming sidewall spacers on sidewalls of the gate electrode, performing ion implantation into the silicon substrate to form source/drain regions, forming silicide regions over the source/drain regions and the gate electrode, depositing an interlayer insulating film thereon, forming contact holes reaching the source/drain regions through the interlayer insulating film, and burying conductive plugs in the contact holes.

Concomitant with an improvement in degree of integration of integrated semiconductor devices, the degree of integration of MOS transistors per unit area is improved, and there has been improvement in microfabrication techniques. The wiring interval is decreased compared to that in the past, and positioning margin in exposure also tends to be decreased. The pitch between adjacent gate electrodes is also decreased, for example, to approximately 200 nm.

When the distance between the gate electrode and each of the conductive plugs connected to the source/drain regions is decreased, displacement of the conductive plugs may cause electrical leakage or short circuit between the gate electrode and the source/drain regions.

A process of forming silicide regions on the source/drain regions and the gate electrode is an important process for reducing electrical resistance. A top portion of the gate electrode is expanded also in a lateral direction by a silicide reaction. By this expansion, the distance between the gate electrode and each of the conductive plugs connected to the source/drain regions is decreased, and as a result, the probability of occurrence of leakage and/or short circuit increases.

In order to manufacture a microfabricated MOS transistor with high reliability, various research and development activities have been carried out, and techniques have been disclosed, for example, in Japanese Laid-Open Patent Publication Nos. 11-238879 and 2008-78403.

In a semiconductor device including a microfabricated MOS transistor, it has been desired that leakage and/or short circuit between the gate electrode and source/drain regions be suppressed.

SUMMARY

According to one aspect of the invention, a method of manufacturing a semiconductor device includes forming a gate insulating film over a semiconductor substrate, forming a silicon film over the gate insulating film, forming a resist pattern over the silicon film, etching the silicon film to form a protrusion portion of the silicon film, forming a dummy film over the silicon film, etching the dummy film so that the dummy film partially remains on sidewalls of the protrusion portion, etching the silicon film using the remaining dummy film to form a gate electrode, and performing ion implantation into the semiconductor substrate to form source/drain regions.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 4A:
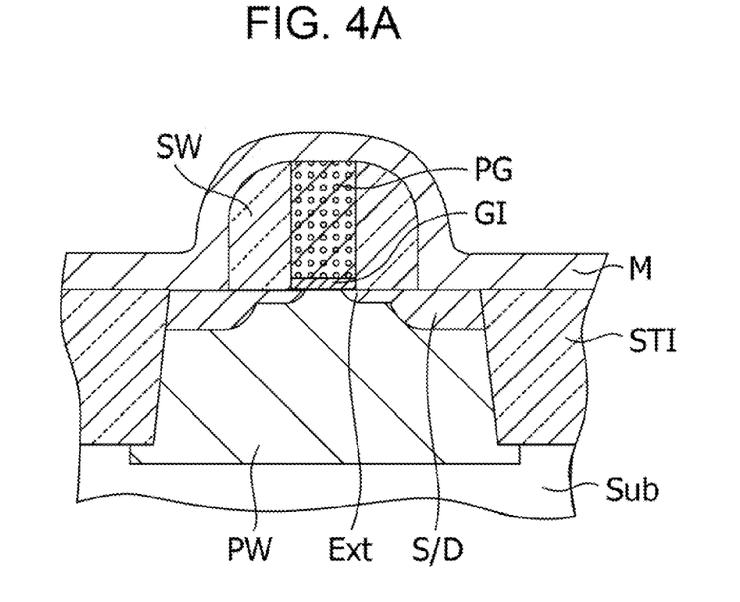
FIGS. 4A to 4C are cross-sectional views each illustrating a step of manufacturing a MOS transistor by an experiment.

As illustrated in FIG. 4A, an element isolation region STI is formed in a silicon substrate by shallow trench isolation (STI). Ion implantation is performed into an active region surrounded by the STI to form a p-type well PW. A gate insulating film GI and a polysilicon gate electrode PG are formed on the p-type well PW. An n-type impurity is ion-implanted into parts of the active region located at two sides of the gate electrode to form extension regions Ext. Sidewall spacers SW are formed on sidewalls of the gate electrode. Into parts of the active region located outside the sidewall spacers, an n-type impurity is deeply ion-implanted to form source/drain regions S/D. In order to form silicide regions, for example, a Ni film is deposited as a metal film M on the silicon substrate to cover the gate electrode.

Figure 4B:
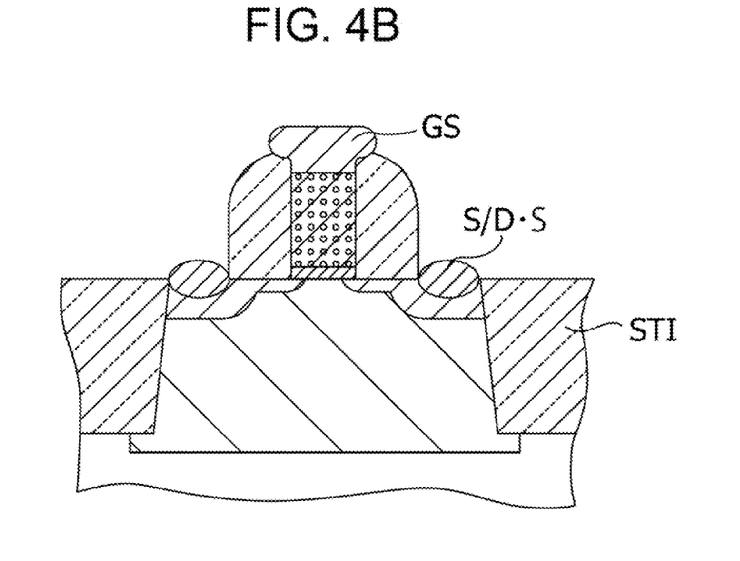

As illustrated in FIG. 4B, the metal film M and silicon of the silicon substrate are allowed to react with each other by an annealing treatment, so that the silicide regions are formed. Unreacted portions of the metal film M are removed. As illustrated in FIG. 4B, the volume of each silicide region increases. Silicide regions S/D·S on the source/drain regions S/D expand primarily to an upper side. A silicide region GS on the gate electrode has a shape expanding in a lateral direction as well as in an upward direction.

Figure 4C:
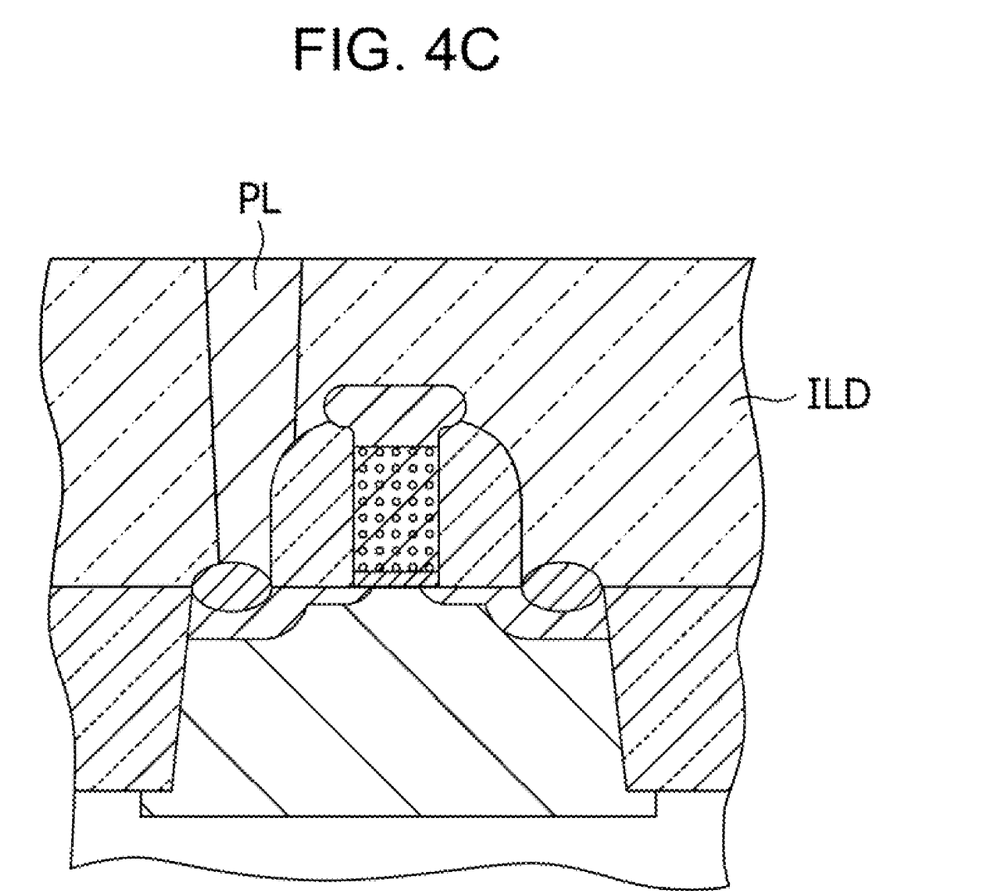

As illustrated in FIG. 4C, an interlayer insulating film ILD is deposited to cover a MOS transistor. Contact holes reaching the source/drain regions through the interlayer insulating film are formed. A conductive plug PL is buried in each of the contact holes. FIG. 4C illustrates the state in which the contact hole is close to the gate electrode in a process of forming contact holes. When the distance between each conductive plug PL and the silicide region GS on the gate electrode is decreased, leakage and/or a short circuit may occur therebetween.

Figure 5:
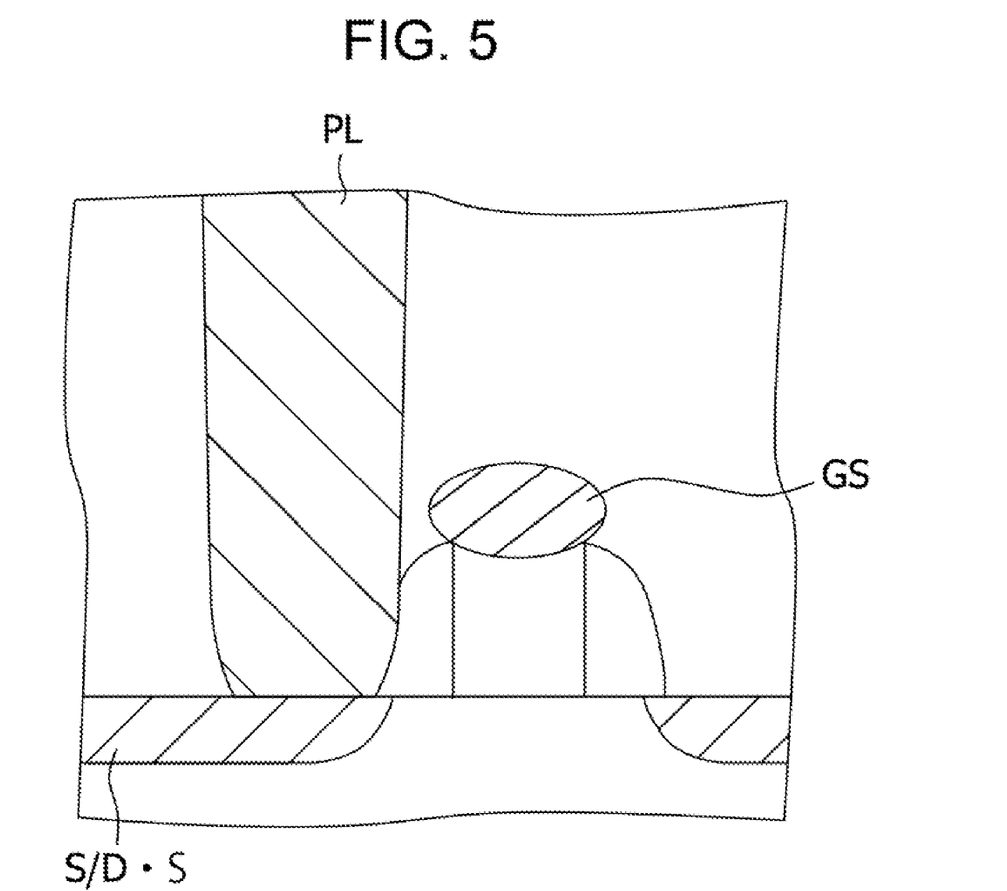
FIG. 5 is a cross-sectional view of a sample formed by the experiment.

FIG. 5 is a cross-sectional view of a sample in which leakage or short circuit occurs. Since the silicide region GS on the gate electrode and the conductive plug PL are close to each other, leakage and/or a short circuit may occur in some cases. It is believed that when the expansion of the silicide region GS on the gate electrode in a lateral direction may be suppressed, the likelihood of leakage and/or a short circuit may be suppressed.

The inventor of the present invention conceived (among other things) that in the polysilicon gate electrode, the width of an upper portion of a polysilicon layer in a source-drain direction, that is, in a gate length direction, at which the silicide reaction occurs is made smaller than the width of a lower portion of the polysilicon layer.

Figure 1A:
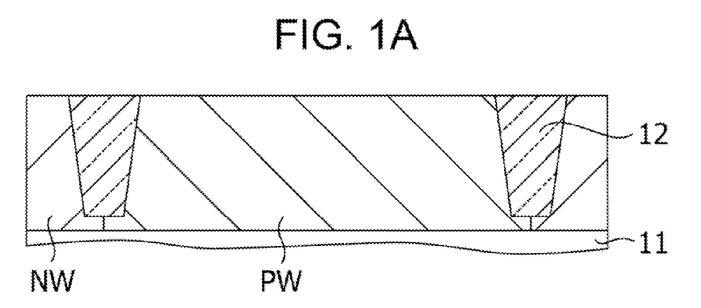
FIGS. 1A to 1N are cross-sectional views illustrating a method of manufacturing a semiconductor device according to a first embodiment of the present invention.
Figure 1B:
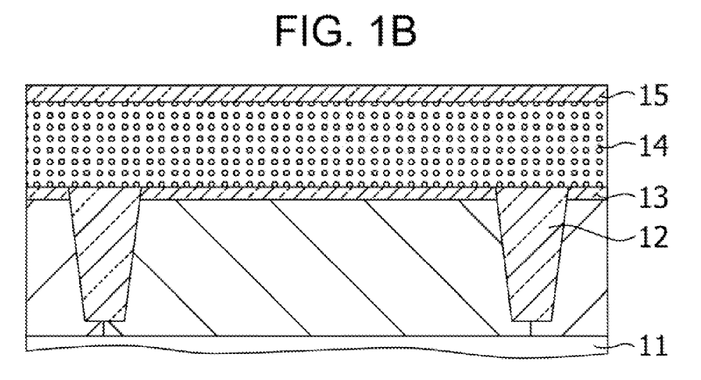
Figure 1C:
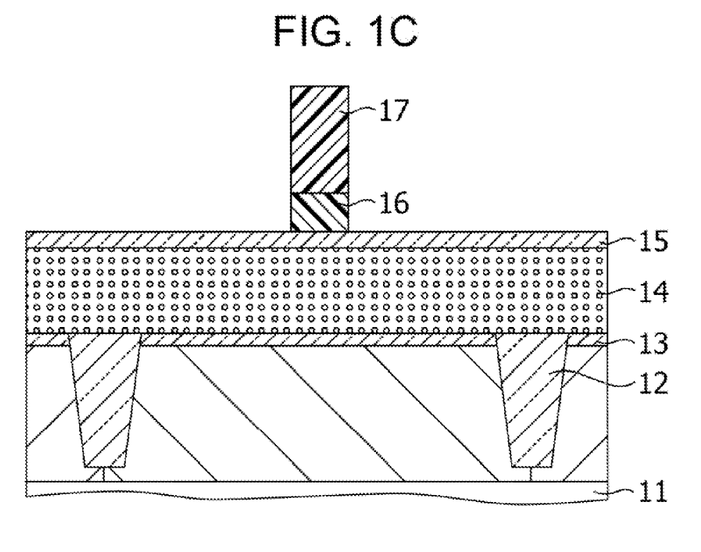
Figure 1D:
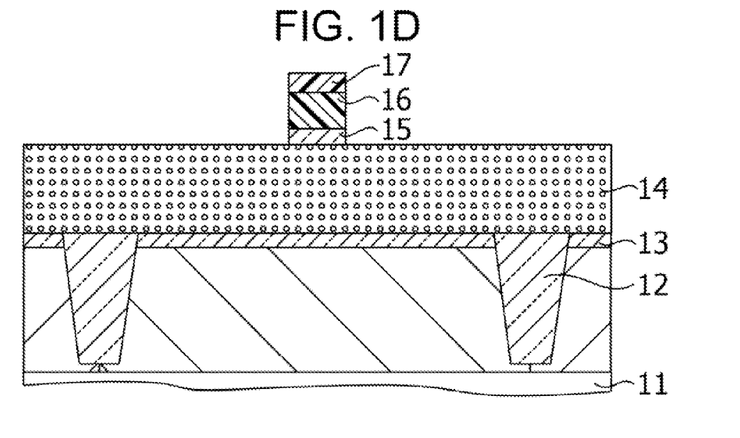
Figure 1E:
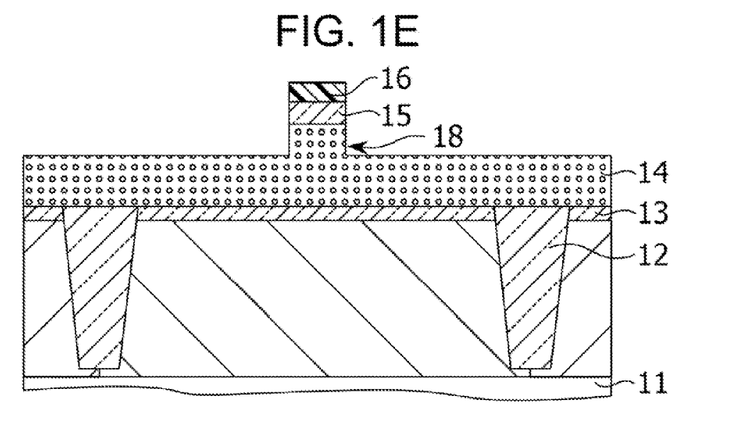
Figure 1F:
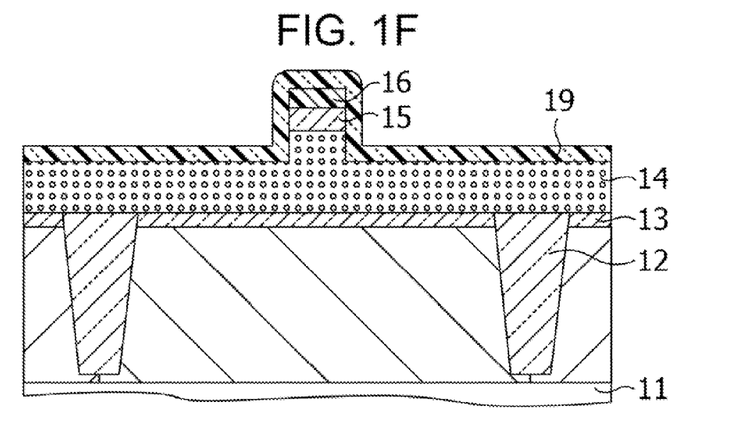
Figure 1G:
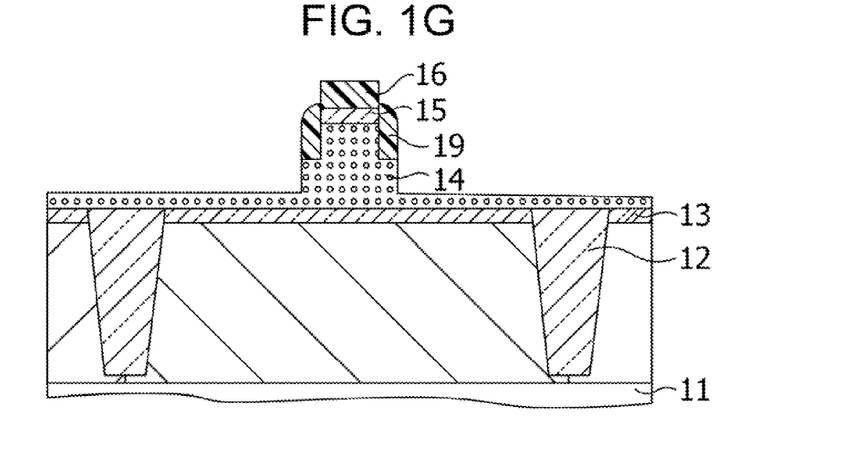
Figure 1H:
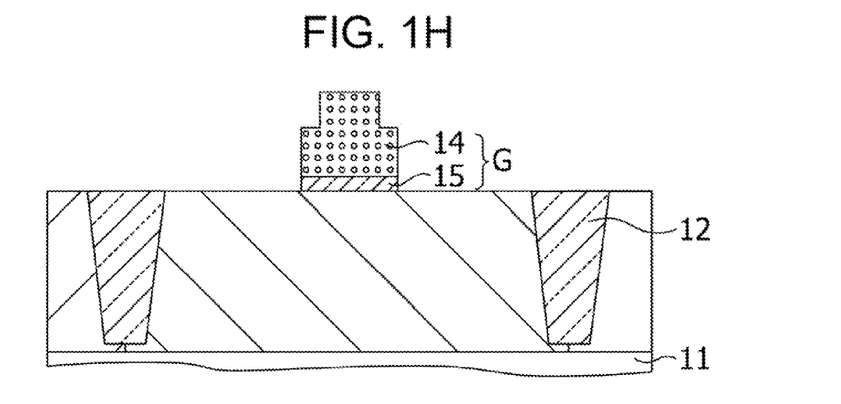
Figure 1I:
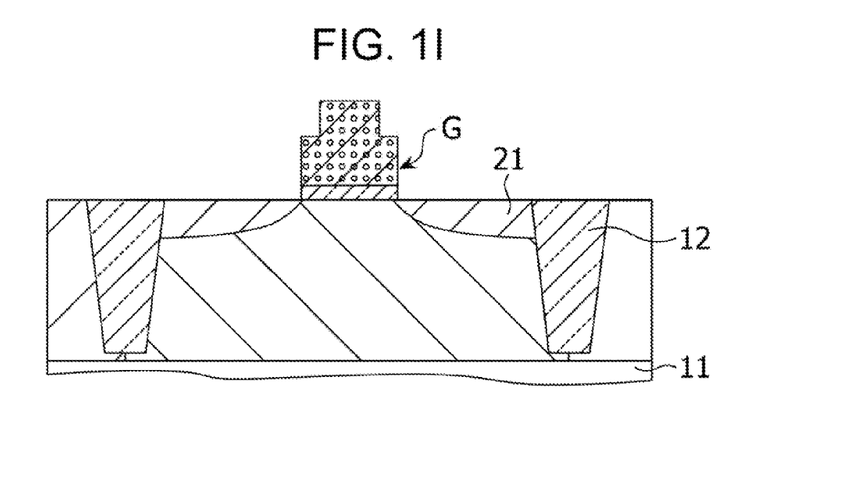
Figure 1J:
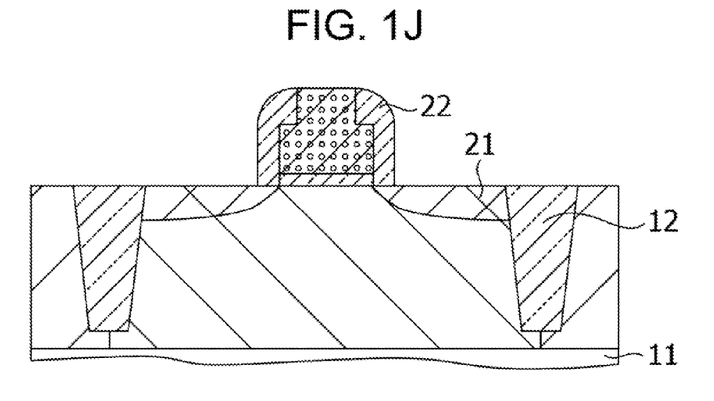
Figure 1K:
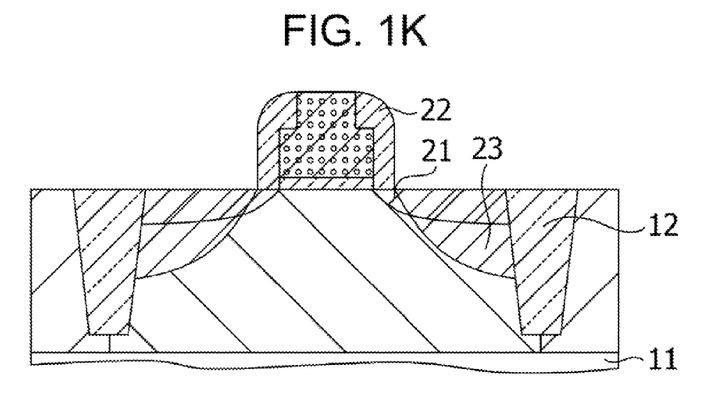
Figure 1L:
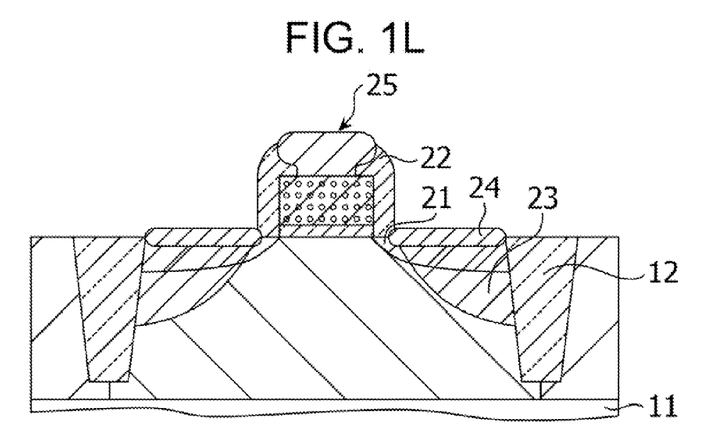
Figure 1M:
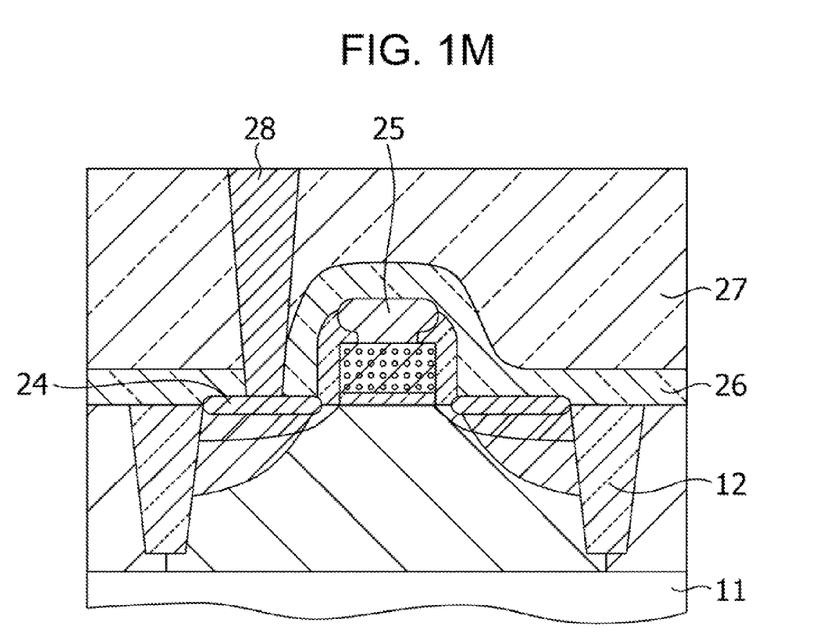
Figure 1N:
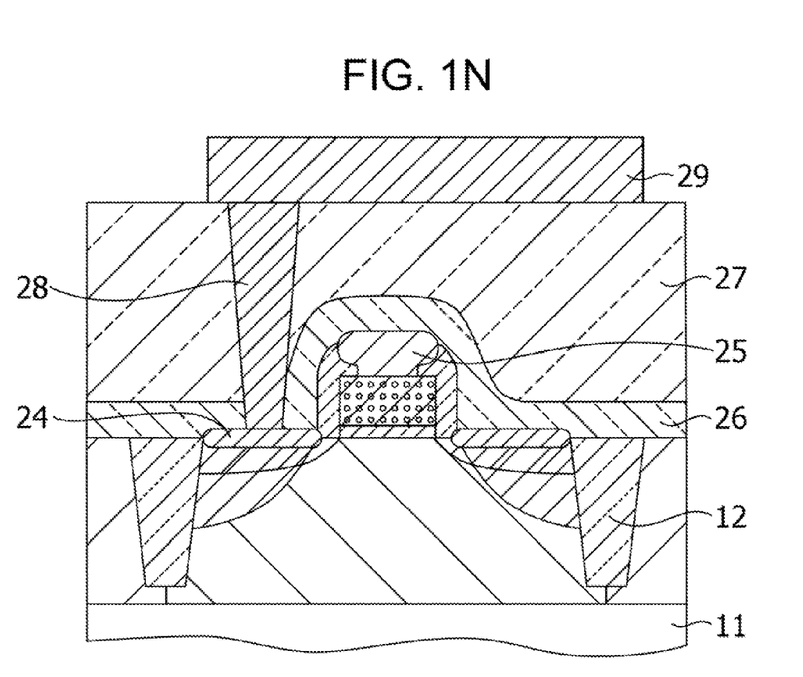

FIGS. 1A to 1N are cross-sectional views illustrating a method for manufacturing a semiconductor device according to a first embodiment.

As illustrated in FIG. 1A, for example, by using a hard mask of a silicon nitride as an etching mask, a silicon substrate 11 is etched to a depth of 250 nm to 350 nm, for example, to a depth of approximately 280 nm to 300 nm, so that an element isolation groove is formed. The width of the groove at a narrow portion is, for example, approximately 140 nm. After a thermal oxidation film is formed on an inside wall surface of the groove, for example, a silicon oxide film is formed by high density plasma chemical vapor deposition (HDP-CVD), and chemical mechanical polishing (CMP) is then performed. Subsequently, the hard mask is removed, so that an element isolation region 12 by shallow trench isolation is formed. Accordingly, an active region surrounded by the element isolation region 12 is defined.

The active region includes an NMOS transistor region and a PMOS transistor. The PMOS transistor region is covered with a photoresist mask, and a p-type impurity is then implanted to form a p-type well PW. Subsequently, the NMOS transistor region is covered with a photoresist mask, and an n-type impurity is then implanted to form an n-type well NW. Hereinafter, a process for manufacturing an NMOS transistor will be described by way of example.

As illustrated in FIG. 1B, the surface of the silicon substrate is heat-treated at approximately 800° C. to 900° C. and, for example, at an oxygen flow rate of approximately 200 sccm to 300 sccm, so that a silicon oxide film is formed on the surface of the active region. In addition, for example, nitrogen may further be introduced into the silicon oxide film in a nitrogen plasma atmosphere. Alternatively, at a flow rate of a $N_2/O_2$ mixed gas of approximately 800 sccm to 1,000 sccm or in a $N_2$ gas atmosphere, annealing at approximately 900° C. to 1,100° C. may be performed for approximately 10 seconds. In the process as described above, a gate insulating film 13 having a film thickness of approximately 1.0 nm to 1.5 nm is formed. Furthermore, a high dielectric-constant insulating film, such as HfO or SiHfO, for example, having a higher dielectric constant than that of a silicon oxide and a silicon oxynitride may also be used as the gate insulating film.

For example, a polysilicon film 14 having a thickness of approximately 90 to 110 nm, such as 105 nm, is deposited on the gate insulating film 13 by CVD using a silane material, such as monosilane or dichlorosilane, at a substrate temperature of approximately 620° C. or more, such as approximately 650° C. Instead of the polysilicon film 14, an amorphous silicon film may be formed at a temperature of approximately 580° C. or less. For example, by CVD using tetraethoxysilane (TEOS) and oxygen, a silicon oxide film having a thickness of 30 nm to 50 nm is formed as a hard mask film 15 on the polysilicon film 14. Instead of the silicon oxide film, a silicon nitride film may be formed by CVD using a silane material and ammonia. In addition, the hard mask film may not be always necessary or used.

As illustrated in FIG. 1C, a bottom antireflection coating film (BARC film) 16 and a photoresist film 17 are applied on the hard mask film 15, followed by performing exposure and development, so that a photoresist pattern is formed. The pattern width is, for example, approximately 70 nm to 100 nm. The BARC film 16 has a composition similar to that of the resist. A photoresist pattern 17 is used as a mask, and the BARC film 16 is patterned by dry etching using $SO_2/O_2$ (approximate flow rates of $3/20$ sccm to $15/20$ sccm), for example. The pattern width may be decreased by performing 20 to 100 percent overreaching, for example.

As illustrated in FIG. 1D, by using the photoresist pattern 17 and a BARC pattern 16 as an etching mask, the hard mask film 15 is dry-etched using $CF_4$ or $CHF_3$, for example. When the hard mask 15 may be patterned, the resist pattern 17 and the BARC pattern 16 may be discarded. For example, after the dry etching, the resist pattern 17 and the BARC pattern 16 may be removed by ashing.

As illustrated in FIG. 1E, by using the hard mask film 15 as an etching mask, the polysilicon film 14 is partially etched. In this etching, for example, by using $HBr/O_2$, $Cl_2/HBr/O_2$, or $CF_4/Cl_2/HBr/O_2$, or the like, the etching depth is controlled by time control. In this case, approximately 40% to 80% of the thickness of the polysilicon film 14 is allowed to remain. Accordingly, a protrusion portion 18 functioning as an upper portion of the gate electrode is formed.

As illustrated in FIG. 1F, for example, a polymer dummy film 19 is formed on the polysilicon film 14 having the protrusion portion 18 thus formed. For example, plasma is generated in a $CH_2F_2$ gas (at a flow rate of approximately 100 to 200 sccm) at an electrical power of approximately 300 W to 500 W and at a pressure of approximately 5 mTorr to 10 mTorr, so that the polymer dummy film 19 is deposited at an in-chamber temperature of approximately 50° C. to 60° C. to have a thickness of approximately 10 nm to 30 nm. The width of a lower portion of the gate electrode which will be described later is determined by the thickness of the dummy film 19 on the sidewall of the protrusion portion 18.

Figure 2A:
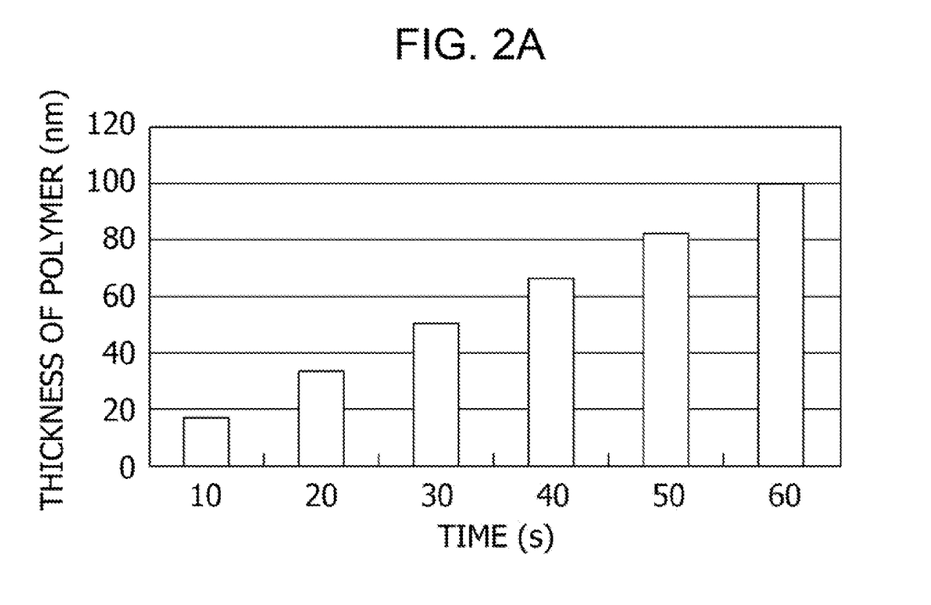
FIG. 2A is a graph showing the time dependence of the thickness of a polymer according to the first embodiment.

FIG. 2A is a graph illustrating the relationship between the time for depositing a polymer and the thickness thereof. As the process time is increased, the thickness of the polymer is increased. Hence, the thickness of the polymer may be controlled by the process time, for example. In addition, besides a $CH_2F_2$ gas, the polymer film may be formed by using $CF_4$, $CH_4$, or the like.

As illustrated in FIG. 1G, the dummy film 19 is anisotropically etched. The polymer film 19 is etched under conditions similar to those for polysilicon. For example, etching is performed using $HBr/O_2$, $Cl_2/HBr/O_2$, or $CF_4/Cl_2/HBr/O_2$, or the like. A part of the polymer film 19 located on the flat portion is removed, and the polymer film partially remains on the side surfaces of the protrusion portion 18 as sidewall spacers. In one example, the polymer film 19 only remains on the side surfaces of the protrusion portion 18. Subsequently, the polymer film 19 and the polysilicon film 14 are etched. The etching time is controlled so that a part of the polysilicon film 14 located on the flat surface is allowed to remain to have a thickness of approximately 20 nm.

As illustrated in FIG. 1H, the remaining polysilicon film 14 is etched under etching conditions in which the etching rate of a polysilicon and that of a silicon oxide are different from each other. When the photoresist film 17 and/or the BARC film 16 remains, removal thereof may be performed by ashing. The dummy film 19 is also removed by ashing. The hard mask 15 is also removed. When the hard mask 15 is composed of a silicon oxide, removal thereof may be performed using diluted hydrofluoric acid. An exposed gate insulating film 13 is also removed. Accordingly, a gate electrode G having a certain width (gate length) at the lower portion and a small width at the upper portion is formed. In addition, when the hard mask is composed of a silicon nitride, removal thereof may be performed using hot phosphoric acid.

Alternatively, a process may also be performed in such a way that after the hard mask 15 is formed from a silicon oxide and is then patterned in FIG. 1D, the photoresist pattern 17 and the BARC pattern 16 are removed, the polysilicon film 14 is partially etched to form the protrusion portion 18, a silicon oxide film is deposited as the dummy film 19, and sidewall space shapes are formed therefrom. In the process illustrated in FIG. 1H, when etching is performed using diluted hydrofluoric acid, the hard mask and the sidewall spacers may be substantially simultaneously removed.

As illustrated in FIG. 1I, an n-type impurity is ion-implanted into the p-type active region using the gate electrode G as a mask to form extension regions 21. The n-type impurity is also ion-implanted into the gate electrode G.

As illustrated in FIG. 1J, for example, a silicon oxide film having a thickness of approximately 10 nm to 30 nm is deposited by CVD, and by performing anisotropic etching, sidewall spacers 22 are formed.

As illustrated in FIG. 1K, by using the gate electrode G and the sidewall spacers 22 as a mask, an n-type impurity is ion-implanted into the p-type active region deeper and heavier than the extension region 21, so that source/drain regions 23 are formed. The n-type impurity is also ion-implanted into polysilicon of the gate electrode G.

As illustrated in FIG. 1L, for example, a Ni film having a thickness of approximately 10 nm to 30 nm is formed by sputtering and is then annealed at approximately 200° C. to 300° C. to perform a silicide reaction with silicon of the silicon substrate, so that silicide regions 24 on the source/drain regions and a silicide region 25 on the gate electrode G are formed. The silicide region 25 is expanded in a lateral direction as well as in a thickness direction. Since a polysilicon gate electrode 14 is formed so that the width of the upper portion is smaller than that of the lower portion, even when the silicide region 25 is expanded in a lateral direction, the width of the silicide region 25 may be suppressed.

As illustrated in FIG. 1M, for example, a silicon nitride film 26 having a thickness of approximately 50 nm to 100 nm is formed on the silicon substrate as a contact etch stopper, and for example, an interlayer insulating film is then formed thereon by depositing a TEOS silicon oxide film 27 having a thickness of approximately 200 nm to 250 nm. Contact holes each having a diameter of approximately 70 nm to 100 nm are formed to reach the silicide regions 24 on the source/drain regions through the interlayer insulating film. Subsequently, for example, a Ti film having a thickness of approximately 5 nm to 10 nm is sputtered, for example, a TiN film having a thickness of approximately 5 nm to 10 nm is sputtered, and for example, a W film is deposited by CVD. Next, parts of the Ti film, the TiN film, and the W film present on the interlayer insulating film are removed by CMP, so that conductive plugs 28 are formed.

As illustrated in FIG. 1N, for example, an Al film is deposited and is then patterned, so that an Al wire 29 connected to the conductive plug 28 is formed. Alternatively, a copper wire may be formed using a damascene method, for example.

Figure 2B:
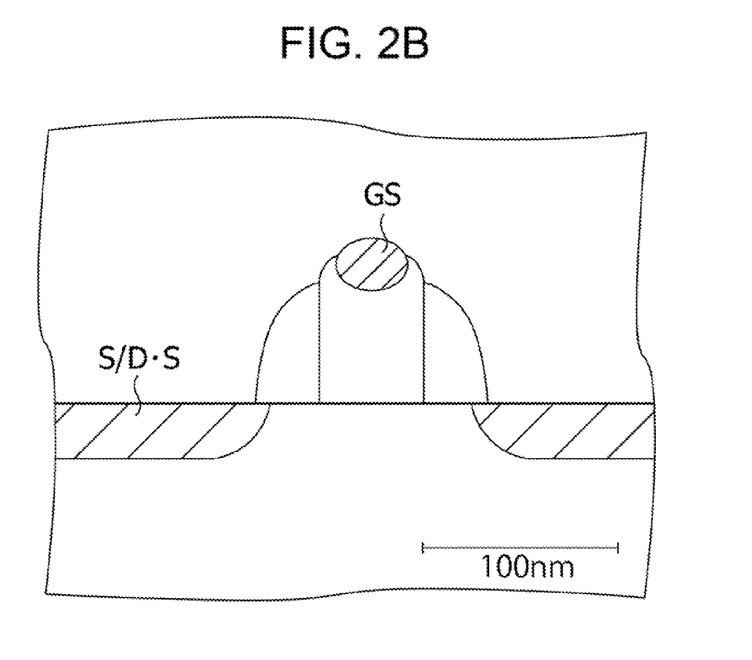
FIG. 2B is a cross-sectional view of a sample.

FIG. 2B is a cross-sectional view of a sample thus formed. Although the conductive plugs are not illustrated, the silicide region GS on the gate electrode and the silicide regions S/D·S on the source/drain regions are illustrated. The width of the gate electrode is approximately 50 nm.

Figure 2C:
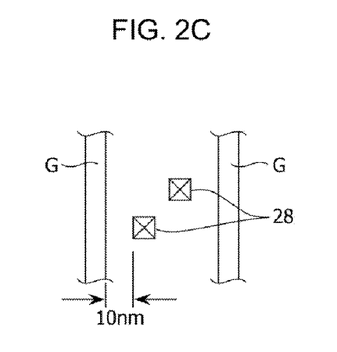
FIG. 2C is a plan view sowing a design value of a planar shape of the sample.

FIG. 2C is a plan view illustrating a planar arrangement of the sample. The distance between the gate electrode G and the conductive plug 28 is set to 10 nm.

Figure 2D:
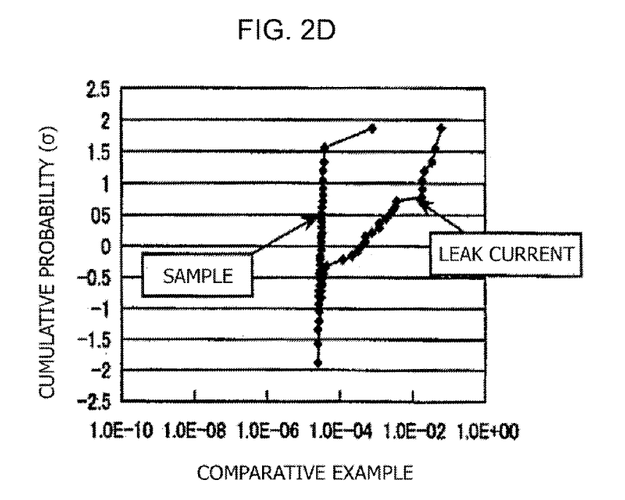
FIG. 2D is a graph illustrating measurement values of a leak current of samples.

FIG. 2D is a graph illustrating the cumulative probability of a leak current measured using a plurality of samples. The horizontal axis indicates a leak current in ampere (A), and the vertical axis indicates the cumulative probability in standard deviation ($\sigma$). Among the samples formed in this embodiment, except for the topmost measurement point, an approximately vertical distribution is illustrated. The leak current may be considered within the acceptable range. According to a comparative example in which a related structure is used, the leak current is increased.

In addition, when the conductivities illustrated in the first embodiment are reversed, a PMOS transistor may be formed. In the PMOS transistor, the structure may be formed in which a Si—Ge crystal is buried in the source/drain regions to apply a compressive stress to the channel region in a channel length direction.

FIGS. 3A to 3E are cross-sectional views illustrating a method for manufacturing a semiconductor device according to a second embodiment.

Figure 3A:
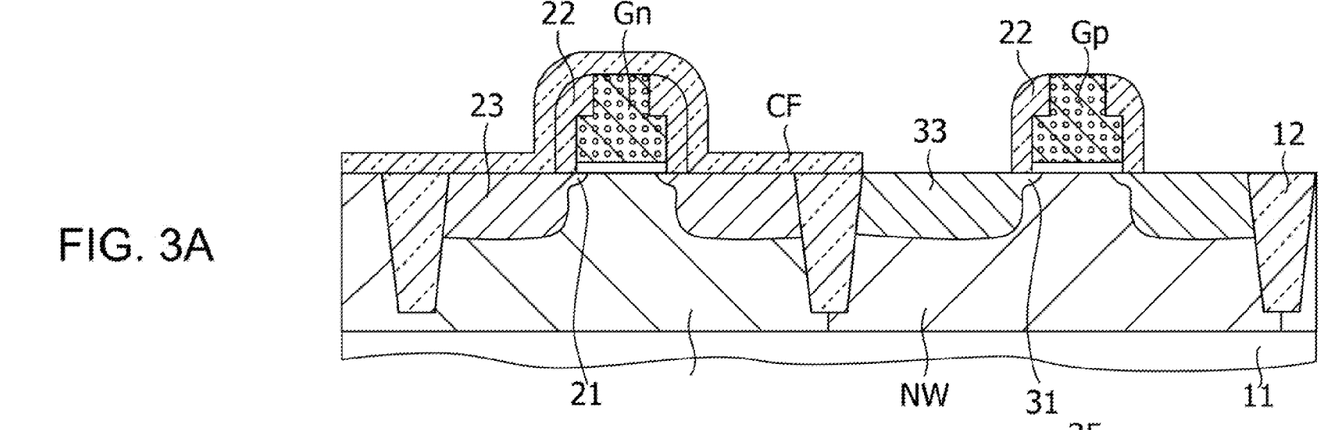
FIGS. 3A to 3E are cross-sectional views illustrating a method of manufacturing a semiconductor device according to a second embodiment.

In the left side of FIG. 3A, an NMOS transistor in the state illustrated in FIG. 1K formed according to the first embodiment is illustrated. The n-type extension regions 21 and the source/drain regions 23 are formed in the p-type well PW, and the width of a lower portion of an n-type gate electrode Gn on the surface of the active region is larger than the width of an upper portion of the electrode Gn. Side surfaces of the gate electrode Gn are covered with the sidewall spacers 22. A PMOS transistor illustrated in the right side of FIG. 3A has a structure in which the conductivities of the NMOS transistor are reversed. In the n-type well NW, p-type extension regions 31 and p-type source/drain regions 33 are formed, and the width of a lower portion of a p-type gate electrode Gp on the surface of the active region is larger than the width of an upper portion of the electrode Gp. Side surfaces of the gate electrode Gp are covered with the sidewall spacers 22. A silicon oxide film having a thickness of approximately 10 nm to 30 nm is deposited by CVD and is then patterned to form a cover film CF covering the NMOS transistor region. This cover film CF is a film to protect the NMOS transistor region when Si—Ge regions are buried in the PMOS transistor region.

Figure 3B:
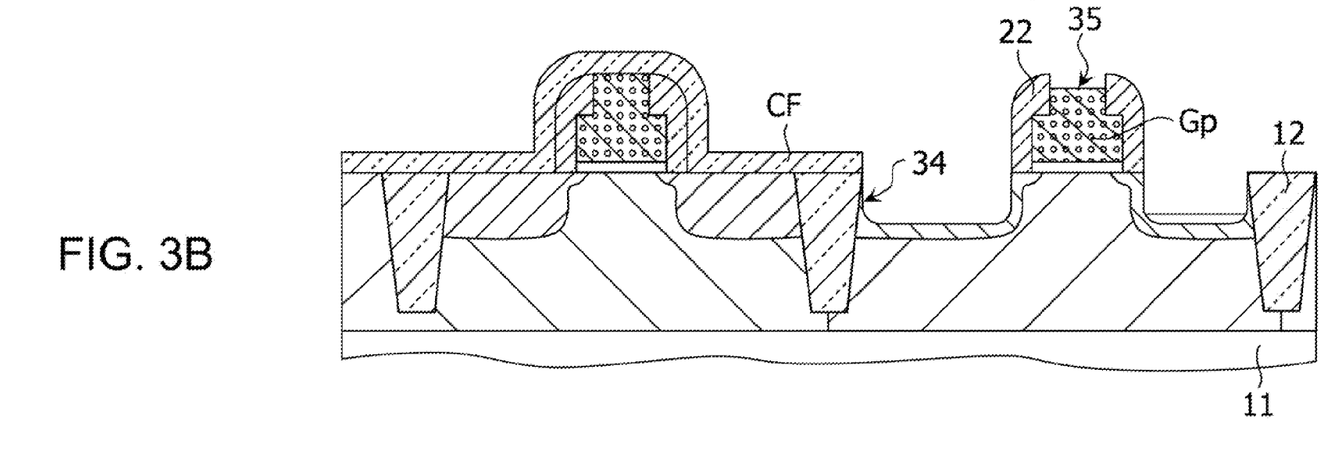

As illustrated in FIG. 3B, the exposed active regions 33 are etched. For example, the source/drain regions are dry-etched using $HBr/O_2$, $Cl_2/HBr/O_2$, or the like to a depth of approximately 20 to 60 nm, so that recess portions 34 are formed. In addition, the gate electrode Gp of polysilicon is also etched, so that a recess portion 35 is formed between the sidewall spacers 22.

Figure 3C:
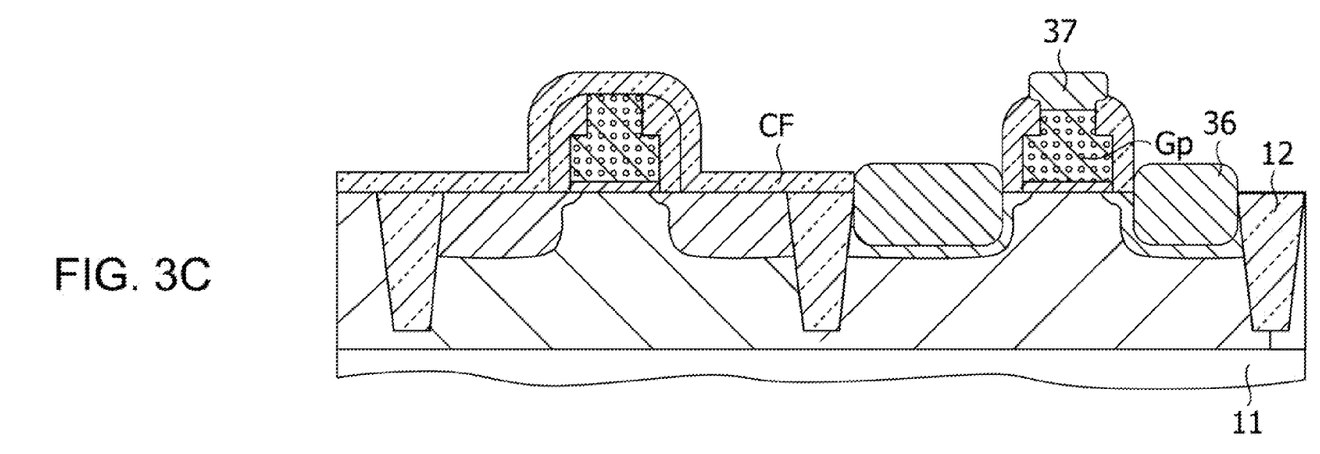

As illustrated in FIG. 3C, by using germanium and a silane material, Si—Ge is epitaxially grown in the recess portions 34 of the source/drain regions. A Si—Ge crystal is grown higher than the surface of the silicon substrate. Growth conditions are selected so that no Si—Ge crystal is grown on the insulating film. In addition, a Si—Ge crystal 37 is also grown on the gate electrode.

Figure 3D:
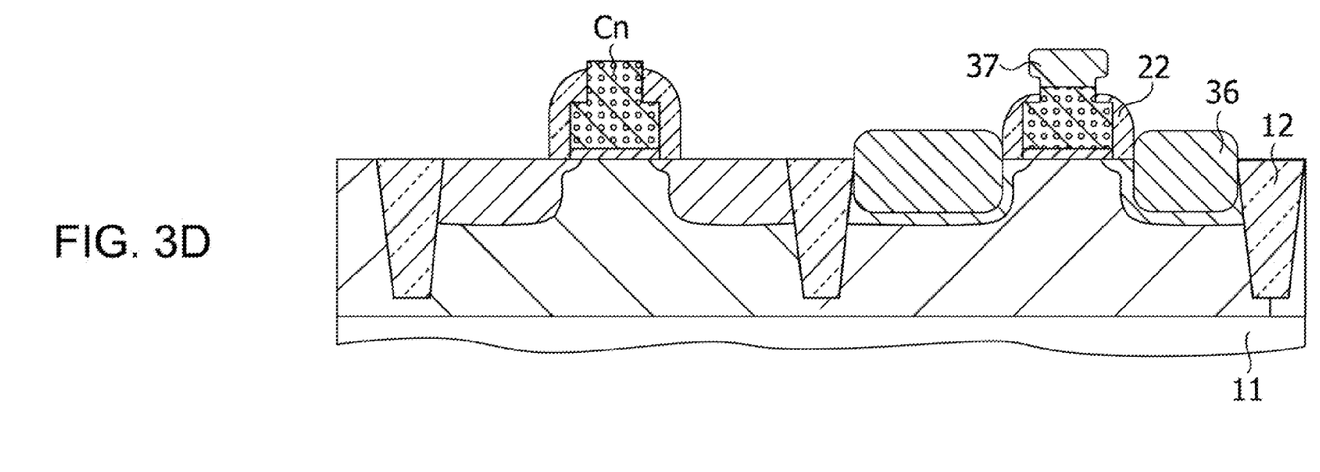

As illustrated in FIG. 3D, the cover film CF is removed. In this process, the sidewall spacers 22 may be partially etched in some cases. In this case, the height of each of the sidewall spacers 22 of the PMOS transistor is decreased.

Figure 3E:
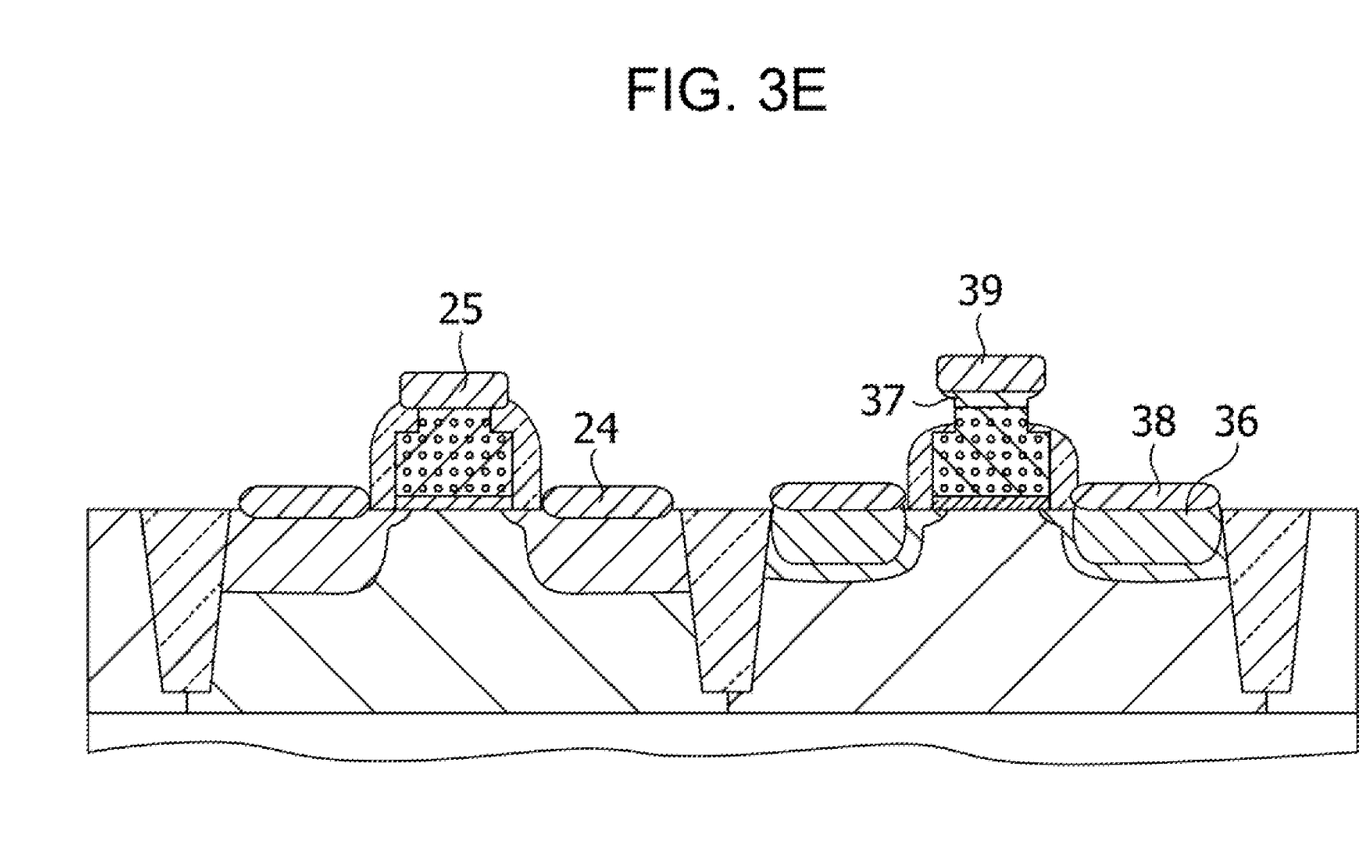

As illustrated in FIG. 3E, for example, a Ni film is deposited by a sputtering method and is then annealed to cause a silicide reaction; hence, the silicide regions 24 and 25 are formed in the NMOS transistor, and silicide regions 38 and 39 are formed on Si—Ge single crystal regions 36 in the source/drain regions of the PMOS transistor and on a Si—Ge polycrystal region 37 on the gate electrode thereof, respectively.

In the PMOS transistor, since the width of the upper portion of the gate electrode is also decreased, the width of the Si—Ge crystal region on the gate electrode is decreased, and hence the width of the silicide region is also decreased. When conductive plugs to be connected to the source/drain regions are formed, the likelihood of leakage and/or a short circuit between the gate electrode and each of the conductive plugs may be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

What is claimed is:

1. A method of manufacturing a semiconductor device comprising:
   forming a gate insulating film over a semiconductor substrate;
   forming a silicon film over the gate insulating film;
   forming a resist pattern over the silicon film;
   etching the silicon film using the resist pattern as a mask to form a protrusion portion of the silicon film;
   forming a dummy film over the silicon film including the protrusion portion after the resist pattern is removed;
   etching the dummy film so that the dummy film partially remains on sidewalls of the protrusion portion;
   etching the silicon film using the remaining dummy film on the sidewalls of the protrusion portion to form a gate electrode; and
   performing ion implantation into the semiconductor substrate using the gate electrode as a mask to form source/drain regions.

2. The method according to claim 1, further comprising:
   after forming the silicon film and before forming the resist pattern, depositing a mask film over the silicon film.

3. The method according to claim 2, further comprising:
   after forming the gate electrode and before forming the source/drain regions, removing the mask film.

4. The method according to claim 1, wherein the dummy film is a polymer film deposited by a vapor phase reaction using one of CH2F2, CF4, and CH4.

5. The method according to claim 3, wherein the mask film and the dummy film are each an inorganic insulating film and are removed in removing of the mask film.

6. The method according to claim 1, further comprising:
   forming silicide regions over the source/drain regions and the gate electrode.

7. The method according to claim 1, further comprising:
   after forming the source/drain regions,
   forming an interlayer insulating film over the semiconductor substrate;
   forming contact holes reaching the source/drain regions through the interlayer insulating film; and
   forming conductive plugs in the contact holes.

8. The method according to claim 7, further comprising:
   after forming the gate electrode and before forming the source/drain regions,
   performing ion implantation into the semiconductor substrate using the gate electrode as a mask to form extension regions; and
   forming sidewall spacers of an insulating material on sidewalls of the gate electrode,
   wherein in performing the ion implantation to form the source/drain regions, the gate electrode and the sidewall spacers are used as a mask.

9. The method according to claim 6, wherein the source/drain regions include a p-type impurity, and
   the method further comprising:
   after forming the source/drain regions,
   etching the semiconductor substrate in the source/drain regions to form recess portions; and
   epitaxially growing first Si—Ge layers in the recess portions.

10. The method according to claim 9,
    wherein in etching the semiconductor substrate to form recess portions, the gate electrode is also etched, and
    in epitaxially growing the first Si—Ge layers, a second Si—Ge layer is grown over the etched gate electrode.

* * * * *